(12) United States Patent
Lin et al.

(10) Patent No.: US 9,484,315 B2
(45) Date of Patent: Nov. 1, 2016

(54) CHIP STRUCTURE HAVING BONDING WIRE

(71) Applicant: Industrial Technology Research Institute, Hsinchu (TW)

(72) Inventors: Yu-Min Lin, Hsinchu County (TW); Po-Chen Lin, Kaohsiung (TW); Jing-Yao Chang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/668,994

(22) Filed: Mar. 26, 2015

(65) Prior Publication Data

US 2016/0163665 A1  Jun. 9, 2016

(30) Foreign Application Priority Data

Dec. 8, 2014 (TW) .............................. 103142590 A

(51) Int. Cl.
*H01L 23/498* (2006.01)
*H01L 23/00* (2006.01)

(52) U.S. Cl.
CPC .............. *H01L 24/08* (2013.01); *H01L 24/48* (2013.01); *H01L 24/45* (2013.01); *H01L 2224/04042* (2013.01); *H01L 2224/05124* (2013.01); *H01L 2224/05147* (2013.01); *H01L 2224/05582* (2013.01); *H01L 2224/05647* (2013.01); *H01L 2224/05655* (2013.01);
(Continued)

(58) Field of Classification Search
CPC ....... H01L 24/08; H01L 24/48; H01L 24/43; H01L 23/48; H01L 23/29; H01L 23/49866; H01L 21/02697

USPC ................. 257/77, 737, 738, 762, 765, 768, 257/E23.02, E23.021, E23.16, E23.162; 438/106, 125, 617, 625

See application file for complete search history.

(56) References Cited

U.S. PATENT DOCUMENTS 4,176,443 A * 12/1979 Iannuzzi ........... H01L 23/53209
228/123.1
5,060,051 A * 10/1991 Usuda ............... H01L 23/53223
257/765

(Continued)

FOREIGN PATENT DOCUMENTS

| CN | 101872754 | 10/2010 |
| TW | 487222 | 5/2002 |
| TW | I443794 | 7/2014 |

OTHER PUBLICATIONS

Yingwei Jiang, et al., "Study of 6 mil Cu Wire Replacing 10-15 mil Al Wire for Maximizing Wire-Bonding Process on Power ICs," IEEE Transactions on Electronics Packaging Manufacturing, vol. 33, No. 2, Apr. 2010, pp. 135-142.

(Continued)

*Primary Examiner* — Dao H Nguyen
(74) *Attorney, Agent, or Firm* — Jianq Chyun IP Office

(57) ABSTRACT

A chip structure includes a chip, a first metal layer, a second metal layer and a bonding wire. The first metal layer is disposed on the chip, and a material of the first metal layer includes nickel or nickel alloy. The second metal layer is disposed on the first metal layer, and a material of the second metal layer includes copper, copper alloy, aluminum, aluminum alloy, palladium or palladium alloy. The bonding wire is connected to the second metal layer, and a material of the bonding wire includes copper or copper alloy.

9 Claims, 1 Drawing Sheet

(52) U.S. Cl.
CPC ............. *H01L 2224/05664* (2013.01); *H01L 2224/45124* (2013.01); *H01L 2224/45147* (2013.01); *H01L 2224/4801* (2013.01); *H01L 2224/48455* (2013.01); *H01L 2924/2076* (2013.01)

(56) References Cited

U.S. PATENT DOCUMENTS

| | | | | |
|---|---|---|---|---|
| 5,298,793 | A * | 3/1994 | Kotani | H01L 23/532 257/765 |
| 7,518,241 | B2 * | 4/2009 | Tai | H01L 24/02 257/738 |
| 8,164,176 | B2 * | 4/2012 | Siepe | H01L 23/3735 257/700 |
| 8,748,305 | B2 | 6/2014 | Chen | |
| 2014/0021620 | A1 * | 1/2014 | Lee | H01L 23/49866 257/768 |
| 2014/0273353 | A1 | 9/2014 | Yasunaga et al. | |
| 2014/0284790 | A1 * | 9/2014 | Matsumoto | H01L 22/32 257/737 |

OTHER PUBLICATIONS

Cheng-Fu Yu, et al., "Cu wire bond microstructure analysis and failure mechanism," Microelectronics Reliability, vol. 51, Issue 1, Jan. 2011, pp. 119-124.

Y. Y. Tan, et al., "Cu-Al IMC Micro Structure Study in Cu Wire Bonding With TEM," 2010 17th IEEE International Symposium on the Physical and Failure Analysis of Integrated Circuits (IPFA), Jul. 5-9, 2010, pp. 1-4.

Wu-Hu Li, et al, "Cu Wire Bonding in Ni/Pd/Au—Ag and Roughened Ni/Pd/Au—Ag Pre-plated Leadframe Packages," 2011 IEEE 13th Electronics Packaging Technology Conference (EPTC), Dec. 7-9, 2011, pp. 794-797.

Ivy Qin, et al., "Wire Bonding of Cu and Pd Coated Cu Wire: Bondability, Reliability, and IMC Formation," 2011 IEEE 61st Electronic Components and Technology Conference (ECTC), May 31, 2011-Jun. 3, 2011, pp. 1489-1495.

Liang Yi Hung, et al., "Investigation of Ultrasonic Pd Coated Cu Wire Wedge Bonding on Different Surface Finish," 2011 IEEE 13th Electronics Packaging Technology Conference (EPTC), Dec. 7-9, 2011, pp. 705-709.

* cited by examiner

CHIP STRUCTURE HAVING BONDING WIRE

CROSS-REFERENCE TO RELATED APPLICATION

This application claims the priority benefit of Taiwan application serial no. 103142590, filed on Dec. 8, 2014. The entirety of the above-mentioned patent application is hereby incorporated by reference herein and made a part of this specification.

BACKGROUND

1. Technical Field

The technical field relates to a chip structure, and more particularly, to a chip structure having a bonding wire.

2. Background

Due to crisis of oil depletion, vehicle energy-saving technology is the most important goal of in current stage of human civilization development. As human populations become concentrated of in cities, people's daily commuting time has gradually increased, and aging of the population has led to prolonged journey time; and therefore, personal electric vehicles focused on vehicular space, safety and energy-saving have been gradually developed, and industries and research institutions have been actively involved in developments of related technologies.

Wire bonding is one of the key technologies in a vehicle power module. During the past, the wire bonding of the vehicle power module is typically performed with an aluminum bonding wire, but with recent sharp increase in the power of the vehicle power module, the industries have gradually tried to replace the aluminum bonding wire with a copper bonding wire, which has a higher melting point and more favorable conductivity. However, an interface between the copper bonding wire and an aluminum bonding pad on a chip is prone to produce intermediate metallic compounds due to a chemical reaction under a high temperature working environment of the high-power vehicle power module, and this chemical reaction can lead a plurality of holes being generated between the copper bonding wire and the aluminum bonding pad, thereby damaging a bonding strength therebetween. In addition, a hardness of the copper bonding wire is higher than a hardness of the aluminum bonding pad, such that the cooper bonding wire is less susceptible to deformation during the wire bonding process, and thus the bonding force during the wire bonding is required to be increased, so that the copper bonding wire can be adequately deformed to attain a favorable bonding strength. Nevertheless, the aforementioned approach might lead to a greater stress concentration and thereby damage the aluminum bonding pad with lower hardness or cause damages to the chip underneath the aluminum bonding pad.

SUMMARY

The disclosure is directed to a chip structure, a bonding wire thereof is capable of maintaining a favorable bonding strength, and the chip structure is capable of preventing the chip from being damaged during a wire bonding process.

An exemplary embodiment of the disclosure provides a chip structure including a chip, a first metal layer, a second metal layer and a bonding wire. The first metal layer is disposed on the chip, and a material of the first metal layer includes nickel or nickel alloy. The second metal layer is disposed on the first metal layer, and a material of the second metal layer includes copper or copper alloy. The bonding wire is connected to the second metal layer, and a material of the bonding wire includes copper or copper alloy.

An exemplary embodiment of the disclosure provides a chip structure including a chip, a first metal layer, a second metal layer and a bonding wire. The first metal layer is disposed on the chip, and a material of the first metal layer includes nickel or nickel alloy. The second metal layer is disposed on the first metal layer, and a material of the second metal layer includes aluminum or aluminum alloy. The bonding wire is connected to the second metal layer, and a material of the bonding wire includes copper or copper alloy.

An exemplary embodiment of the disclosure provides a chip structure including a chip, a first metal layer, a second metal layer and a bonding wire. The first metal layer is disposed on the chip, and a material of the first metal layer includes nickel. The second metal layer is disposed on the first metal layer, and a material of the second metal layer includes palladium or palladium alloy. The bonding wire is connected to the second metal layer, and a material of the bonding wire includes copper or copper alloy.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
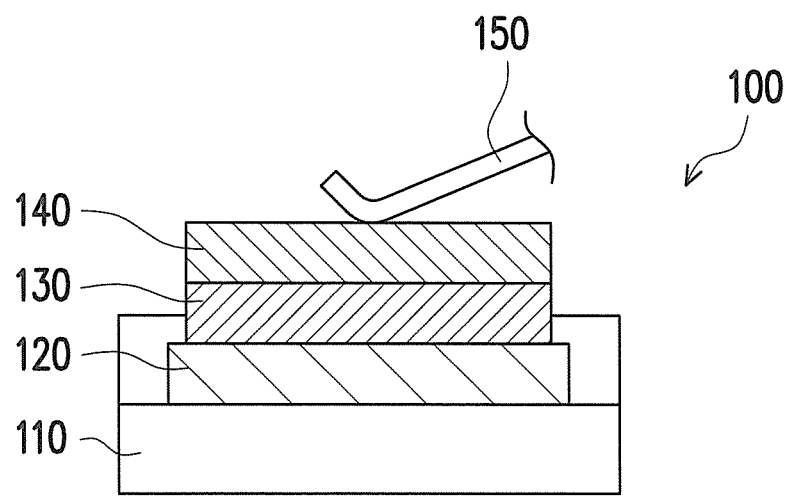
FIG. 1 is a schematic diagram illustrating a chip structure according to one of the exemplary embodiments of the disclosure.

FIG. 1 is a schematic diagram illustrating a chip structure according to one of the exemplary embodiments of the disclosure. Referring to FIG. 1, a chip structure 100 of the embodiment includes a chip 110, a first metal layer 130, a second metal layer 140 and a bonding wire 150. The bonding pad 120 is disposed on the chip 110, the first metal layer 130 is disposed on the chip 110, and a material of the first metal layer 130 is, for example, nickel or nickel alloy. The second metal layer 140 is disposed on the first metal layer 130, and a material of the second metal layer 140 is, for example, copper, copper alloy, aluminum, aluminum alloy, palladium or palladium alloy. The bonding wire 150 is, for example, connected to the second metal layer 140 via a wedge bonding process, a material of the bonding wire 150 is, for example, copper or copper alloy, and a wire diameter of the bonding wire 150 is, for example, greater than 102 μm so as to be applied in a high-power apparatus. The chip structure 100 further includes a bonding pad 120, and the bonding pad 120 is disposed between the first metal layer 130 and the second metal layer 140. A material of the bonding pad 120 is, for example, aluminum, aluminum alloy, copper or copper alloy.

Since the material of the first metal layer 130 disposed on the bonding pad 120 is nickel or nickel alloy, the first metal layer 130 has a higher hardness; and therefore, a bonding force generated during the wire bonding can be absorbed by the first metal layer 130, thereby preventing the bonding pad 120 or the chip 110 located underneath the bonding pad 120 from being damaged in the wire bonding process. In addition, since the material of the second metal layer 140 disposed on the first metal layer 130 is copper, copper alloy, aluminum, aluminum alloy, palladium or palladium alloy, the second metal layer 140 can be easily bonded with the bonding wire 150, and thus prevents the bonding wire 150 having the material being copper or copper alloy and the bonding pad 120 having the material being aluminum, aluminum alloy, copper or copper alloy from being directly bonded with each other to cause defects in an interface therebetween due to chemical reaction under a high temperature working environment and lowering the reliability of the chip structure, thereby enabling the bonding wire 150 to maintain a favorable bonding strength. Specifically, with such a configuration as described in the above, the chip structure 100 of the embodiment may have a favorable reliability under a temperature cycling test of between −55 to 125 degree Celsius.

In the embodiment, the second metal layer 140 having the material being copper may be coordinated with the bonding wire 150 having the material being copper, the second metal layer 140 having the material being copper may be coordinated with the bonding wire 150 having the material being copper alloy, the second metal layer 140 having the material being copper alloy may be coordinated with the bonding wire 150 having the material being copper, the second metal layer 140 having the material being copper alloy may be coordinated with the bonding wire 150 having the material being copper alloy, the second metal layer 140 having the material being aluminum may be coordinated with the bonding wire 150 having the material being copper, the second metal layer 140 having the material being aluminum may be coordinated with the bonding wire 150 having the material being copper alloy, the second metal layer 140 having the material being aluminum alloy may be coordinated with the bonding wire 150 having the material being copper, the second metal layer 140 having the material being aluminum alloy may be coordinated with the bonding wire 150 having the material being copper alloy, the second metal layer 140 having the material being palladium may be coordinated with the bonding wire 150 having the material being copper, the second metal layer 140 having the material being palladium may be coordinated with the bonding wire 150 having the material being copper alloy, the second metal layer 140 having the material being palladium alloy may be coordinated with the bonding wire 150 having the material being copper, or the second metal layer 140 having the material being palladium alloy may be coordinated with the bonding wire 150 having the material being copper alloy, but the disclosure is not limited thereto.

In the embodiment, the first metal layer 130 having the material being nickel or nickel alloy in addition to protecting the chip 120 located thereunder from being damaged by the bonding force generated during the wire bonding with its higher hardness, the first metal layer 130 may also be considered as a diffusion barrier layer located between the bonding pad 120 and second metal layer 140 for preventing the metals between the bonding pad 120 and the second metal layer 140 from interdiffusion.

Figure 2:
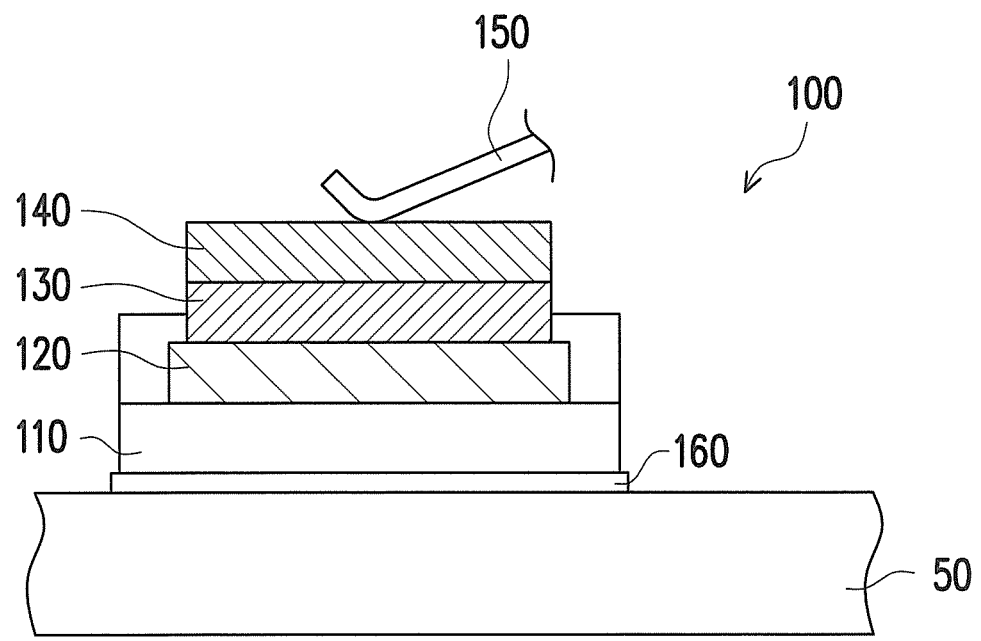
FIG. 2 illustrates that the chip structure of FIG. 1 being disposed on a substrate.

FIG. 2 illustrates that the chip structure of FIG. 1 being disposed on a substrate. The chip structure 100 as shown in FIG. 1 is, for example, applicable in a vehicle power module, wherein the chip structure 100 is adapted to be disposed on a substrate 50 of the vehicle power module through a bonding layer 160 as shown in FIG. 2, and is adapted to electrically connected to an electrical contact or other electrical elements on the substrate 50 through the bonding wire 150. The chip 110 is, for example, an insulated gate bipolar transistor (IGBT), diodes, a metal oxide field effect transistor (MOSFET) or other types of power semiconductor. The substrate 50 is, for example, a direct bonded copper (DBC) substrate or other types of ceramic substrate. In other embodiments, the chip 110 may be other types of chip, and the chip structure 100 may be applied in other types of apparatus, such that the disclosure is not limited thereto.

In summary, in the chip structure of the disclosure, the bonding pad is disposed with the first metal layer thereon, and the material of the first metal layer is nickel or nickel alloy, so that the first metal layer can have higher hardness. Therefore, the bonding force generated during the wire bonding can be absorbed by the first metal layer, so as to prevent the bonding pad and the chip located underneath the bonding pad from being damaged in the wire bonding process. Moreover, in the chip structure of the disclosure, the first metal layer is disposed with the second metal layer thereon for connecting with the bonding wire, and the material of the second metal layer is copper, copper alloy, aluminum, aluminum alloy, palladium or palladium alloy so that the second metal layer can be easily bonded with the bonding wire; and therefore, the bonding wire having the material being copper or copper alloy and the bonding pad having the material being aluminum, aluminum alloy, copper or copper alloy may be prevented from being directly bonded with each other to cause defects in the interface therebetween due to the chemical reaction under the high temperature working environment and lowering the reliability of the chip structure, and thereby enable the bonding wire to maintain the favorable bonding strength.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip structure, comprising:
   a chip;
   a first metal layer, disposed on the chip, a material of the first metal layer comprising nickel or nickel alloy;
   a second metal layer, disposed on the first metal layer, a material of the second metal layer comprising copper or copper alloy;
   a wedge bonding wire, wedge bonded to the second metal layer, a material of the wedge bonding wire comprising copper or copper alloy, wherein a material at a site of the second metal layer that is directly in contact with the wedge bonding wire comprises copper; and
   a bonding pad disposed between the chip and the first metal layer, and a material of the bonding pad comprises aluminum, aluminum alloy, copper or copper alloy.

2. The chip structure as recited in claim 1, wherein a wire diameter of the wedge bonding wire is greater than 102 µm.

3. The chip structure as recited in claim 1, wherein the chip is a power semiconductor.

4. A chip structure, comprising:
   a chip;
   a first metal layer, disposed on the chip, a material of the first metal layer comprising nickel or nickel alloy;

a second metal layer, disposed on the first metal layer, a material of the second metal layer comprising aluminum or aluminum alloy;

a wedge bonding wire, wedge bonded to the second metal layer, a material of the wedge bonding wire comprising copper or copper alloy, wherein a material at a site of the second metal layer that is directly in contact with the wedge bonding wire comprises aluminum; and a bonding pad disposed between the chip and the first metal layer, and a material of the bonding pad comprises aluminum, aluminum alloy, copper or copper alloy.

5. The chip structure as recited in claim 4, wherein a wire diameter of the wedge bonding wire is greater than 102 μm.

6. The chip structure as recited in claim 4, wherein the chip is a power semiconductor.

7. A chip structure, comprising:

a chip;

a first metal layer, disposed on the chip, a material of the first metal layer comprising nickel;

a second metal layer, disposed on the first metal layer, a material of the second metal layer comprising palladium or palladium alloy;

a wedge bonding wire, wedge bonded to the second metal layer, a material of the wedge bonding wire comprising copper or copper alloy, wherein a material at a site of the second metal layer that is directly in contact with the wedge bonding wire comprises palladium; and a bonding pad disposed between the chip and the first metal layer, and a material of the bonding pad comprises aluminum, aluminum alloy, copper or copper alloy.

8. The chip structure as recited in claim 7, wherein a wire diameter of the wedge bonding wire is greater than 102 μm.

9. The chip structure as recited in claim 7, wherein the chip is a power semiconductor.

* * * * *